United States Patent
Okamoto et al.

(10) Patent No.: US 11,799,471 B2
(45) Date of Patent: Oct. 24, 2023

(54) SEMICONDUCTOR DEVICE

(71) Applicant: Socionext Inc., Kanagawa (JP)

(72) Inventors: Atsushi Okamoto, Yokohama (JP); Hirotaka Takeno, Yokohama (JP); Junji Iwahori, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 18/069,084

(22) Filed: Dec. 20, 2022

(65) Prior Publication Data

US 2023/0120959 A1    Apr. 20, 2023

Related U.S. Application Data

(62) Division of application No. 17/577,701, filed on Jan. 18, 2022, now Pat. No. 11,563,432.

(30) Foreign Application Priority Data

Jan. 19, 2021 (JP) ................................. 2021-006441

(51) Int. Cl.
*H03K 17/00* (2006.01)
*H03K 17/16* (2006.01)
*H03K 17/687* (2006.01)
*H03K 19/00* (2006.01)

(52) U.S. Cl.
CPC ....... *H03K 17/161* (2013.01); *H03K 17/6871* (2013.01); *H03K 19/0008* (2013.01)

(58) Field of Classification Search
CPC ............. H03K 17/161; H03K 17/6871; H03K 19/0008
See application file for complete search history.

(56) References Cited

U.S. PATENT DOCUMENTS

| | | | |
|---|---|---|---|
| 7,623,364 B2 | 11/2009 | Sasaki et al. | |
| 8,499,272 B2 * | 7/2013 | Ishii | .................. H01L 27/11898 |
| | | | 716/120 |
| 10,141,336 B2 | 11/2018 | Lee | |

(Continued)

FOREIGN PATENT DOCUMENTS

| | | |
|---|---|---|
| JP | 2018-190760 A | 11/2018 |
| WO | 2017/208887 A1 | 12/2017 |

OTHER PUBLICATIONS

Notice of Allowance dated Oct. 25, 2022 issued in U.S. Appl. No. 17/577,701.

*Primary Examiner* — Tuan T Lam
(74) *Attorney, Agent, or Firm* — McDermott Will & Emery LLP

(57) ABSTRACT

A semiconductor device includes a first area including a logic circuit, a second area including a functional circuit, a first power line, a second power line that supplies a power to the logic circuit and the functional circuit, and a first power switch circuit connected to the first power line and the second power line, wherein the first power switch circuit includes a first transistor larger than a transistor provided in the logic circuit and being connected to the first power line and the second power line, an end cap provided in an area next to the functional circuit, and a second transistor provided between the end cap and an area including the first transistor, the second transistor being of a same size as the transistor provided in the logic circuit and being connected to the first power line and the second power line.

8 Claims, 15 Drawing Sheets

(56) References Cited

U.S. PATENT DOCUMENTS

| | | | |
|---|---|---|---|
| 2008/0093632 A1* | 4/2008 | Sakurabayashi | ............................ H01L 27/11807 257/E23.153 |
| 2008/0211568 A1* | 9/2008 | Pacha | ................ H03K 19/0016 327/429 |
| 2009/0033155 A1 | 2/2009 | Kanno et al. | |
| 2009/0140309 A1 | 6/2009 | Katou | |
| 2018/0315743 A1 | 11/2018 | Takeno et al. | |
| 2019/0081029 A1 | 3/2019 | Okamoto et al. | |
| 2019/0214377 A1 | 7/2019 | Ryu et al. | |
| 2019/0244900 A1 | 8/2019 | Frederick, Jr. et al. | |
| 2019/0312024 A1 | 10/2019 | Takeno et al. | |

\* cited by examiner

SEMICONDUCTOR DEVICE

CROSS-REFERENCE TO RELATED APPLICATION

This application is a divisional of U.S. patent application Ser. No. 17/577,701, filed on Jan. 18, 2022, which claims the benefit of foreign priority to Japanese Patent Application No. 2021-006441, filed on Jan. 19, 2021, which is incorporated herein by reference in its entirety.

FIELD

The present disclosure relates to a semiconductor device.

BACKGROUND

According to a conventional technique, in order to reduce a leakage current of a semiconductor device, power switch circuits may be provided between a power line and a virtual power line serving as a power line for a plurality of circuit blocks, and the power switch circuits are turned ON when the circuit blocks operate.

SUMMARY

A semiconductor device according to the present disclosure includes a first area in which a logic circuit is provided, a second area in which a functional circuit that is different from the logic circuit is provided, and a first power switch circuit provided next to the second area, the first power switch circuit being connected to a first power line and a second power line that supplies a power to the logic circuit and the functional circuit, wherein the first power switch circuit includes a first transistor that is larger than a transistor provided in the logic circuit, the first transistor being connected to the first power line and the second power line, an end cap provided in an area next to the functional circuit, and a second transistor provided between the end cap and an area in which the first transistor is provided, the second transistor being of a same size as the transistor provided in the logic circuit, and the second transistor being connected to connect the first power line and the second power line.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

Figure 1:
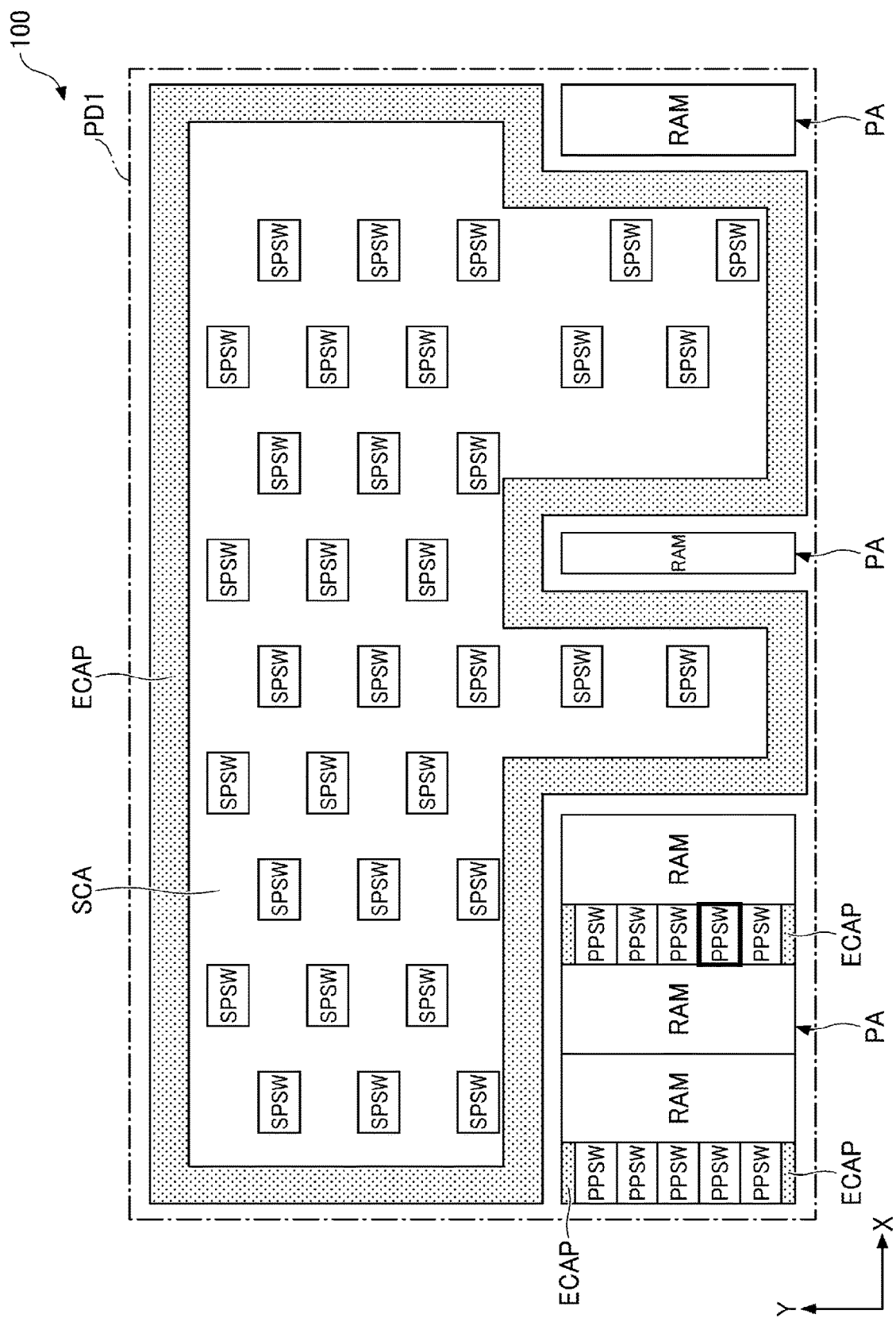
FIG. 1 is a drawing illustrating an example of a layout of a semiconductor device according to a first embodiment.

According to a conventional technique, in order to reduce a leakage current of a semiconductor device, power switch circuits may be provided between a power line and a virtual power line serving as a power line for a plurality of circuit blocks, and the power switch circuits are turned ON when the circuit blocks operate.

In order to increase the power supply capacity of the power switch circuit, the size of a transistor provided in the power switch circuit is designed to be larger than the sizes of a cell transistor provided in a logic circuit. In a case where transistors of different sizes are arranged next to one another, gate electrodes and the like of small transistors are likely to vary in shape during manufacturing of a semiconductor device. In order to reduce the variation in shape, transistors that are different in size from one another are arranged with intervals determined according to a layout rule. For example, with a vacant area being provided at an end of a power switch circuit, transistors of the power switch circuit and transistors of the logic circuit and the like provided next to the power switch circuit are arranged with intervals that satisfy the layout rule. For example, dummy gate electrodes, dummy transistors, and the like are provided in the vacant area of the power switch circuit. (See, for example, U.S. patent Ser. No. 10/141,336, United States Patent Application Publication No. 2019/0244900, United States Patent Application Publication No. 2019/0214377, Japanese Patent Laid-Open No. 2018-190760, and International Publication No. 2017/208887)

Recently, in order to achieve higher integration and reduce leakage currents in semiconductor devices, planar field effect transistors (planar FETs) that are conventionally provided in semiconductor devices are now being replaced with, for example, fin field-effect transistors (FinFETs) and the like that have a three-dimensional structure. Accordingly, a difference between the size of a transistor provided in a logic circuit and the size of a transistor provided in a power switch circuit is likely to increase. In addition, in order to reduce the variation in the shapes of the gate electrodes and the like during manufacturing, a relatively large vacant area is provided at an end of the power switch circuit.

In accordance with an increase in the size of the vacant area, the size of the power switch circuit increases, and the power supply capacity per unit size decreases. Generally, multiple power switch circuits are provided in a semiconductor device. Therefore, in accordance with an increase in the size of the power switch circuit, the size of the logic circuit that can be provided in the semiconductor device decreases. When the size of the logic circuit is to be maintained, the chip size of the semiconductor device increases.

Accordingly, it is desired to alleviate the reduction of the power supply capacity even in a case where the vacant area is required in the power switch circuit.

Hereinafter, embodiments are specifically described with reference to the attached drawings. In the following explanation, power lines for supplying powers are denoted with power names and reference symbols.

First Embodiment

FIG. 1 illustrates an example of a layout of a semiconductor device according to a first embodiment. For example, a semiconductor device 100 as illustrated in FIG. 1 includes at least one power domain PD1. A standard cell area SCA including multiple standard cells, not illustrated, and multiple peripheral areas PA including one or more random access memories (RAMS) are provided in the power domain PD1. The standard cell area SCA is an example of a first area in which a logic circuit is provided. The peripheral area PA is an example of a second area in which a functional circuit that is different from the logic circuit is provided.

FIG. 1 illustrates only one power domain PD1, but the semiconductor device 100 may include multiple power domains. In FIG. 1, the left side of the power domain PD1 may be a chip edge of the semiconductor device 100. The transistor provided in the semiconductor device 100 is not particularly limited, but may be, for example, a FinFET. The FinFET is explained with reference to FIG. 6.

In the standard cell area SCA, multiple power switch circuits SPSW are arranged with intervals. An end cap ECAP indicated by a shading pattern is provided around the standard cell area SCA. The end cap ECAP includes dummy gate electrodes or dummy transistors. In the standard cell area SCA, the power switch circuit SPSW does not have to be provided, and only standard cells may be provided.

In each of the peripheral areas PA, one or more RAMs are provided. In some of the peripheral areas PA, multiple power switch circuits PPSW and the end caps ECAP are provided next to RAMs. The RAM is an example of a memory intellectual property (memory IP) that is a hard macro, and is an example of a functional circuit including a predetermined function. The power switch circuit PPSW is an example of a first power switch circuit. The power switch circuit SPSW is an example of a second power switch circuit.

Figure 2:
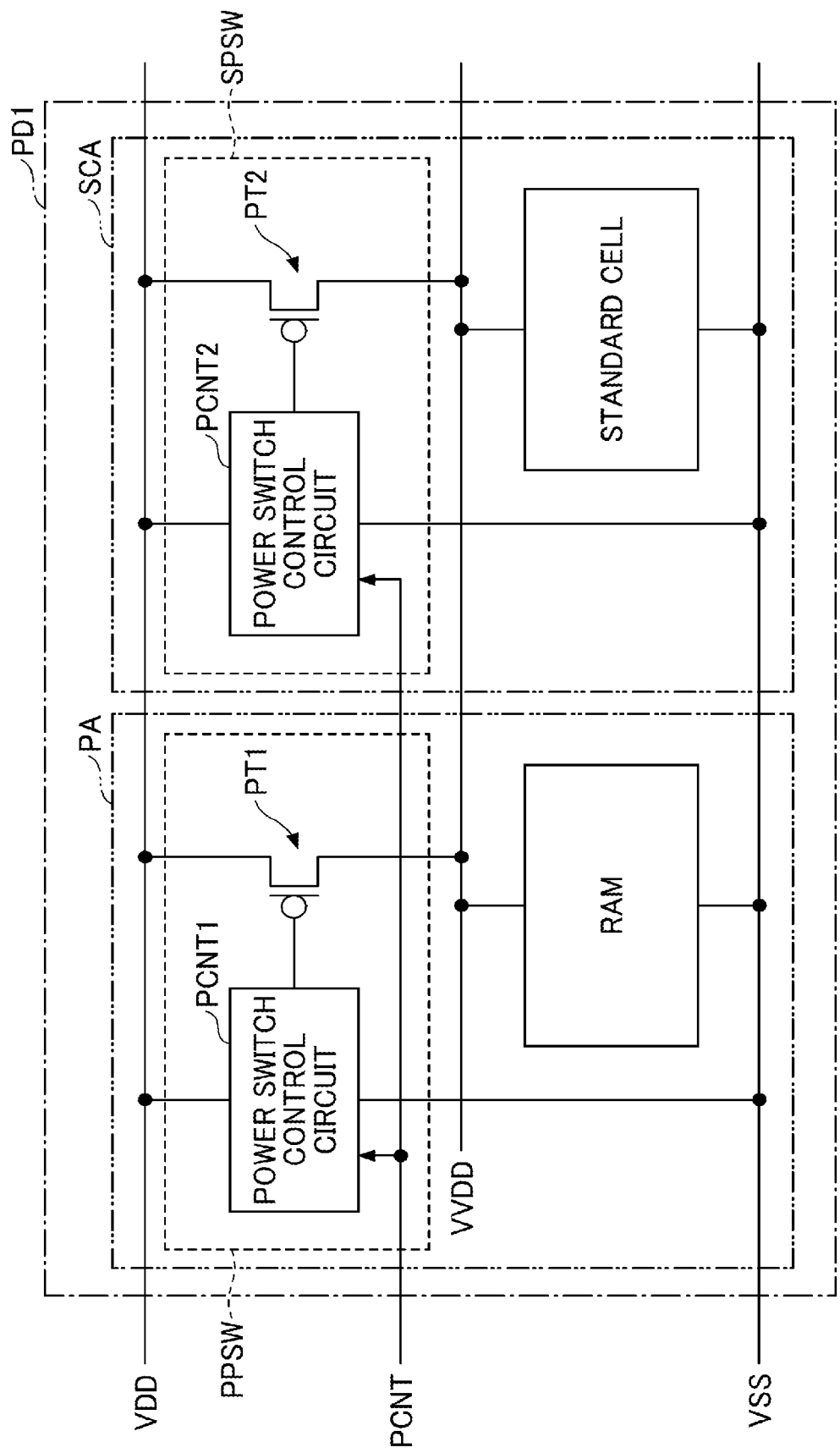
FIG. 2 is a block diagram illustrating an example of power switch circuits SPSW and PPSW of FIG. 1.

FIG. 2 illustrates an example of the power switch circuits SPSW and PPSW of FIG. 1. The power switch circuit PPSW includes a P-channel transistor PT1 and a power switch control circuit PCNT1. The power switch circuit SPSW includes a P-channel transistor PT2 and a power switch control circuit PCNT2. In actual implementation, each of the P-channel transistors PT1 and PT2 includes multiple transistors connected in parallel. The power switch circuit SPSW and the power switch circuit PPSW may include N-channel transistors, instead of the P-channel transistor PT1 and the P-channel transistor PT2. In this case, the source of the N-channel transistor is connected to a ground line VSS; and the drain of the N-channel transistor is connected to a virtual ground line that is connected to the logic circuit of the standard cell to supply the ground potential.

The source of the P-channel transistor PT1 is connected to, for example, a power line VDD to which an external power VDD is provided; and the drain of the P-channel transistor is connected to a virtual power line VVDD that is connected to the power terminals of the standard cell and the RAM. The power line VDD is an example of a first power line, and the virtual power line VVDD is an example of a second power line. The gate electrode of the P-channel transistor PT1 is connected to the output of the power switch control circuit PCNT1.

The source of the P-channel transistor PT2 is connected to the power line VDD, and the drain of the P-channel transistor is connected to the virtual power line VVDD. The gate electrode of the P-channel transistor PT2 is connected to the output of the power switch control circuit PCNT2.

Because the power switch control circuits PCNT1 and PCNT2 operate at all times, the power switch control circuits PCNT1 and PCNT2 are connected to the power line VDD and the ground line VSS, and operate according to the power control signal PCNT. In a case where the power control signal PCNT indicates an active mode in which the circuit in the power domain PD1 is caused to operate, the power switch control circuit PCNT1 causes the ground voltage VSS to be supplied to the gate electrode of the P-channel transistor PT1. Accordingly, the P-channel transistor PT1 is turned ON, and the power line VDD and the virtual power line VVDD are connected to each other.

In a case where the power control signal PCNT indicates an active mode, the power switch control circuit PCNT2 causes the ground voltage VSS to be supplied to the gate electrode of the P-channel transistor PT2. Accordingly, the P-channel transistor PT2 is turned ON, and the power line VDD and the virtual power line VVDD are connected to each other.

In a case where the power control signal PCNT indicates a power down mode, the power switch control circuit PCNT1 causes the power voltage VDD to be supplied to the gate electrode of the P-channel transistor PT1. Accordingly, the P-channel transistor PT1 is turned OFF, and the connection between the power line VDD and the virtual power line VVDD is cut off.

In a case where the power control signal PCNT indicates a power down mode, the power switch control circuit PCNT2 causes the power voltage VDD to be supplied to the gate electrode of the P-channel transistor PT2. Accordingly, the P-channel transistor PT2 is turned OFF, and the connection between the power line VDD and the virtual power line VVDD is cut off. Accordingly, the P-channel transistors PT1 and PT2 operate according to the common power control signal PCNT, and function as a power switch that is connected to the power line VDD and the virtual power line VVDD.

The power terminal of the RAM is connected to the virtual power line VVDD, and the ground terminal of the RAM is connected to the ground line VSS. Likewise, the power terminal of the standard cell is connected to the virtual power line VVDD, and the ground terminal of the standard cell is connected to the ground line VSS.

The P-channel transistors PT1 and PT2 are turned ON during the active mode, so that the power line VDD is connected to the virtual power line VVDD. Accordingly, during the active mode, the RAM and the standard cell in the power domain PD1 operate by receiving the power voltage VDD via the virtual power line VVDD. Conversely, during the power down mode, the P-channel transistors PT1 and PT2 are turned OFF, so that the connection between the power line VDD and the virtual power line VVDD is cut off. Accordingly, during the power down mode, the power voltage VDD is not supplied to the RAM and the standard cell in the power domain PD1, so that the RAM and the standard cell in the power domain PD1 stop operations.

The gate electrodes of multiple P-channel transistors PT1 may receive control signals at points in time different from one another from the power switch control circuits PCNT1, so that the multiple P-channel transistors PT1 are successively turned ON and successively turned OFF. Likewise, the gate electrodes of multiple P-channel transistors PT2 may receive control signals at points in time different from one another from the power switch control circuits PCNT2, so that the multiple P-channel transistors PT2 are successively turned ON and successively turned OFF.

By causing the P-channel transistors PT1 (or PT2) to operate at different points in time, a current is prevented from rapidly flowing from the power VDD to the virtual power line VVDD. Accordingly, power noise that occurs at the start of operations of the power switch circuits PPSW and SPSW can be alleviated.

Figure 3:
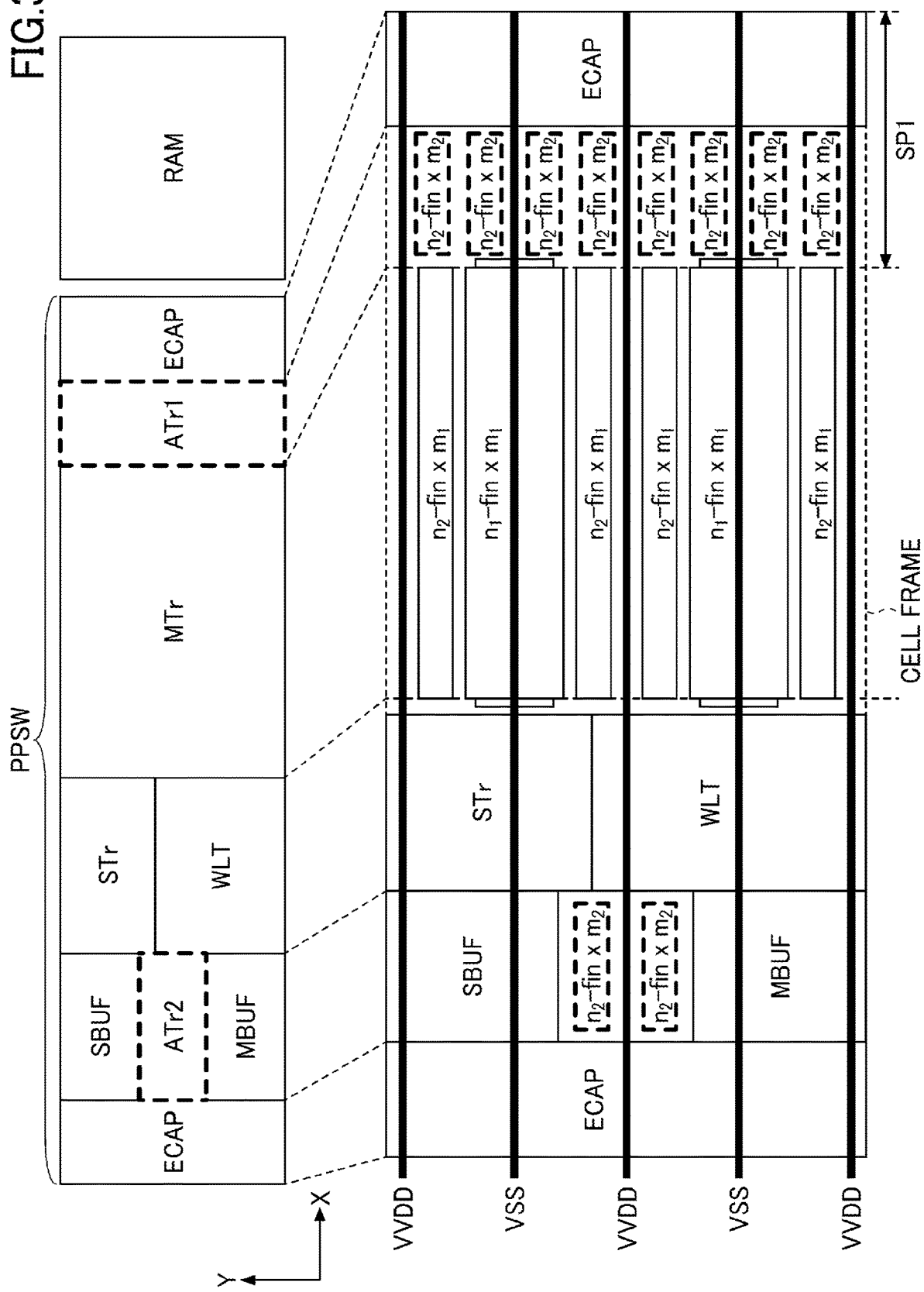
FIG. 3 is a drawing illustrating an example of a layout of the power switch circuit PPSW provided in the peripheral area of FIG. 1.

FIG. 3 illustrates an example of a layout of the power switch circuit PPSW provided in the peripheral area PA of FIG. 1. In FIG. 3, for example, the power switch circuit PPSW is a four-row height cell that uses four areas spanning between five power lines (VVDD and VSS) extending in the X direction. The power switch circuit PPSW may be a double height cell (a two-row height cell), or may be an eight-row height cell. The X direction is an example of a first direction.

The power switch circuit PPSW includes a main transistor MTr, a sub-transistor STr, additional transistors ATr1 and ATr2, a well tap WLT, a main buffer unit MBUF, a sub-buffer unit SBUF, and two end caps ECAP. The main transistor MTr, the sub-transistor STr, and the additional transistors ATr1 and ATr2 include multiple P-channel transistors corresponding to the P-channel transistor PT1 as illustrated in FIG. 2. The main transistor MTr and the sub-transistor STr are an example of a first transistor. The additional transistor ATr1 is an example of a second transistor. The additional transistor ATr2 is an example of a fifth transistor.

The main transistor MTr includes multiple transistors including $n_1$ fins and $m_1$ gate electrodes (hereinafter also referred to as $n_1$-fins×$m_1$ transistors). The main transistor MTr includes multiple transistors including $n_2$ fins and $m_1$ gate electrodes (hereinafter also referred to as $n_2$-fins×$m_1$ transistors). The additional transistors ATr1 and ATr2 include multiple transistors including $n_2$ fins and $m_2$ gate electrodes (hereinafter also referred to as $n_2$-fins×$m_2$ transistors). In this case, $n_1$, $n_2$, $m_1$ and $m_2$ are any given natural numbers that satisfy the relationships of $n_1 > n_2$ and $m_1 > m_2$.

The sizes of the respective transistors are different according to the number of fins and the number of gate electrodes. For example, in a case where $n_1=8$, $n_2=3$, $m_1=10$, and $m_2=1$, the sizes of the transistor are, in an ascending order of the size, the size of $n_1$-fin×$m_1$ transistor>the size of $n_2$-fin×$m_1$ transistor>the size of $n_2$-fin×$m_2$ transistor. For example, the size of the $n_2$-fin×$m_2$ transistor is the same as the size of any one of the multiple types of transistors provided in the logic circuit of the standard cell area SCA of FIG. 1.

The main buffer unit MBUF and sub-buffer unit SBUF are included in the power switch control circuit PCNT1 as illustrated in FIG. 2. The main buffer unit MBUF controls the operations of the main transistor MTr and the additional transistors ATr1 and ATr2, and the sub-buffer unit SBUF controls the operation of the sub-transistor STr. The additional transistors ATr1 and ATr2 may be controlled by the sub-buffer unit SBUF.

The well tap WLT supplies the power voltage VVDD to well areas where P-channel transistors are formed. Two end caps ECAP are provided at both ends in the X direction, i.e., the horizontal direction of FIG. 3.

In this embodiment, according to the layout rule of the semiconductor device 100, the ends of the $n_1$-fin×$m_1$ transistors in the X direction and the end of the layout area of the power switch circuit PPSW are spaced apart by a space SP1 or greater. The rule of the space SP1 is set so as to alleviate variation in the shapes of the gate electrodes and the like of the $n_1$-fin×$m_1$ transistors during manufacturing of the semiconductor device 100 due to external factors such as other circuits provided next to the power switch circuit PPSW and to alleviate variation in the electrical characteristics of the transistors.

For example, the width of the end cap ECAP in the X direction is smaller than the space SP1, and there is a vacant area between the end cap ECAP and the $n_1$-fin×$m_1$ transistor. In this embodiment, an additional transistor ATr1 that functions as a power switch is provided in this vacant area. In addition, in another vacant area of the power switch circuit PPSW (specifically, in this example, a vacant area between the main buffer unit MBUF and the sub-buffer unit SBUF), the additional transistor ATr2 that functions as a power switch is provided.

In this manner, the main transistor MTr, the sub-transistor STr, and the additional transistors ATr1 and ATr2 function as a power switch connected to the power line VDD and the virtual power line VVDD. Therefore, in the power switch circuit PPSW, the power supply capacity of the power switch circuit PPSW can be improved by the additional transistor ATr1 provided in the vacant area that occurs due to the limitation associated with the layout rule (i.e., the space SP1).

In this case, the additional transistor ATr1 has the same structure as the $n_2$-fin×$m_2$ transistor used for the logic circuit provided in the standard cell area SCA. Therefore, this can contribute to the reduction of variation in the shapes of the gate electrodes and the like of circuits provided next to the power switch circuit PPSW.

In addition, in the power switch circuit PPSW, the power supply capacity of the power switch circuit PPSW can be improved by the additional transistor ATr2 provided in the vacant area that occurs due to the circuit layout. As a result, the power supply capacity can be improved without increasing the layout area of the power switch circuit PPSW.

Specifically, by providing the additional transistors ATr1 and ATr2 in the vacant area, the power supply capacity of the P-channel transistor PT1 can be improved while alleviating the increase of the layout area of the power switch circuit PPSW.

Figure 4:
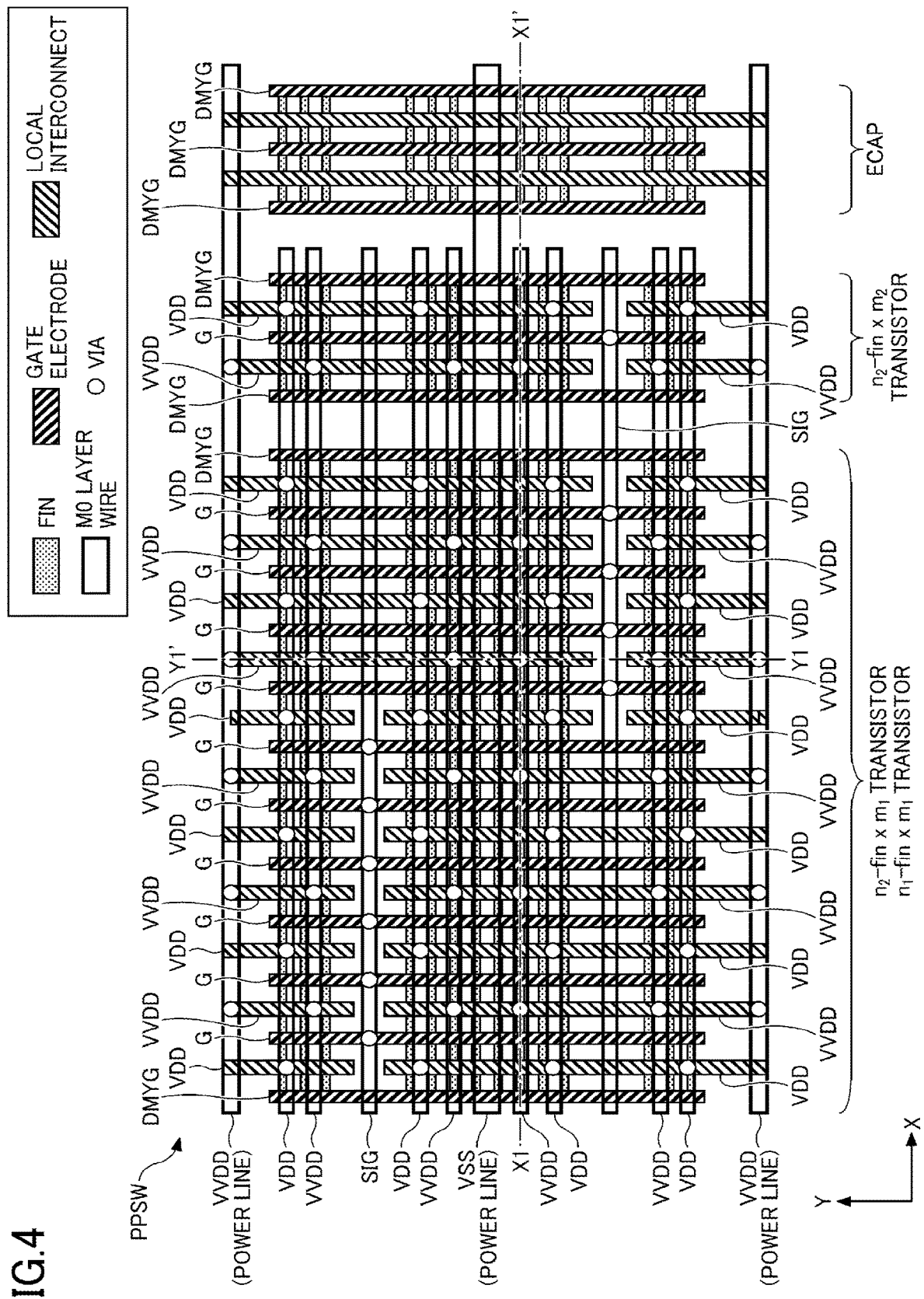
FIG. 4 is a drawing illustrating an example of a layout of power wires of the power switch circuit PPSW of FIG. 3.

FIG. 4 illustrates an example of a layout of the power wires in the power switch circuit PPSW of FIG. 3. FIG. 4 illustrates a layout corresponding to a double height cell including the main transistor MTr, the additional transistors, and the end cap ECAP on the right side in the power switch circuit PPSW of FIG. 3. In the following explanation, the virtual power line VVDD and the ground line VSS connected from the outside of the power switch circuit PPSW may also be referred to as power lines VVDD and VSS, respectively. The virtual power line VVDD and the power line VDD that are closed in the power switch circuit PPSW may also be referred to as wires VVDD and VDD, respectively. In the example of FIG. 4, $n_1=8$, $n_2=3$, $m_1=10$, and $m_2=1$.

Two power lines VVDD and a single power line VSS are formed by using an M0 layer. The M0 layer is a metal wire layer that is provided closest to the semiconductor substrate. Wires in the M0 layer extend in the X direction (the horizontal direction of FIG. 4). Between the power line VSS and each of the power lines VVDD, wires VDD and VVDD and a signal line SIG are formed by using the M0 layer. For example, the signal line SIG is a gate wire of the P-channel transistor PT1 as illustrated in FIG. 2.

A local interconnect VDD extending in the Y direction is connected to the wire VDD in the M0 layer through a via. The Y direction is an example of a second direction perpendicular to the X direction. The wire VDD in the M0 layer is connected to a power line VDD formed by using a metal wire layer in an upper layer through a via, not illustrated. A local interconnect VVDD extending in the Y direction is connected to the wire VVDD in the M0 layer and the power line VVDD in the M0 layer through vias. The wire VVDD in the M0 layer and the power line VVDD may be connected to a power line VVDD formed by using the metal wire layer in the upper layer. The local interconnects VDD and VVDD are provided between gate electrodes G extending in the Y direction.

Fins extend in the X direction, and are arranged spaced apart in the Y direction. For example, the $n_2$-fin×$m_1$ transistor includes dummy gate electrodes DMYG on both sides in the X direction, and therefore, the $n_2$-fin×$m_1$ transistor includes ($m_1$+2) gate electrodes. Likewise, the $n_2$-fin×$m_2$ transistor includes dummy gate electrodes DMYG on both sides in the X direction, and therefore, the $n_2$-fin×$m_2$ transistor includes ($m_2$+2) gate electrodes. In the example as illustrated in FIG. 4, the end cap ECAP includes three dummy gate electrodes DMYG and dummy local interconnects provided between neighboring dummy gate electrodes DMYG.

In the $n_2$-fin×$m_1$ transistor and the $n_2$-fin×$m_2$ transistor, a source area S or a drain area D is formed between any given two gate electrodes G provided next to each other. The source areas S and the drain areas D are formed alternately with the gate electrode G being interposed therebetween. The wire VDD is connected to the source area S. The wire VVDD is connected to the drain area D. In the FinFET, fins are formed in each of the source areas S and the drain areas D. Therefore, the local interconnect VDD is connected to a fin that functions as the source area S, and the local interconnect VVDD is connected to a fin that functions as the drain area D.

Figure 5:
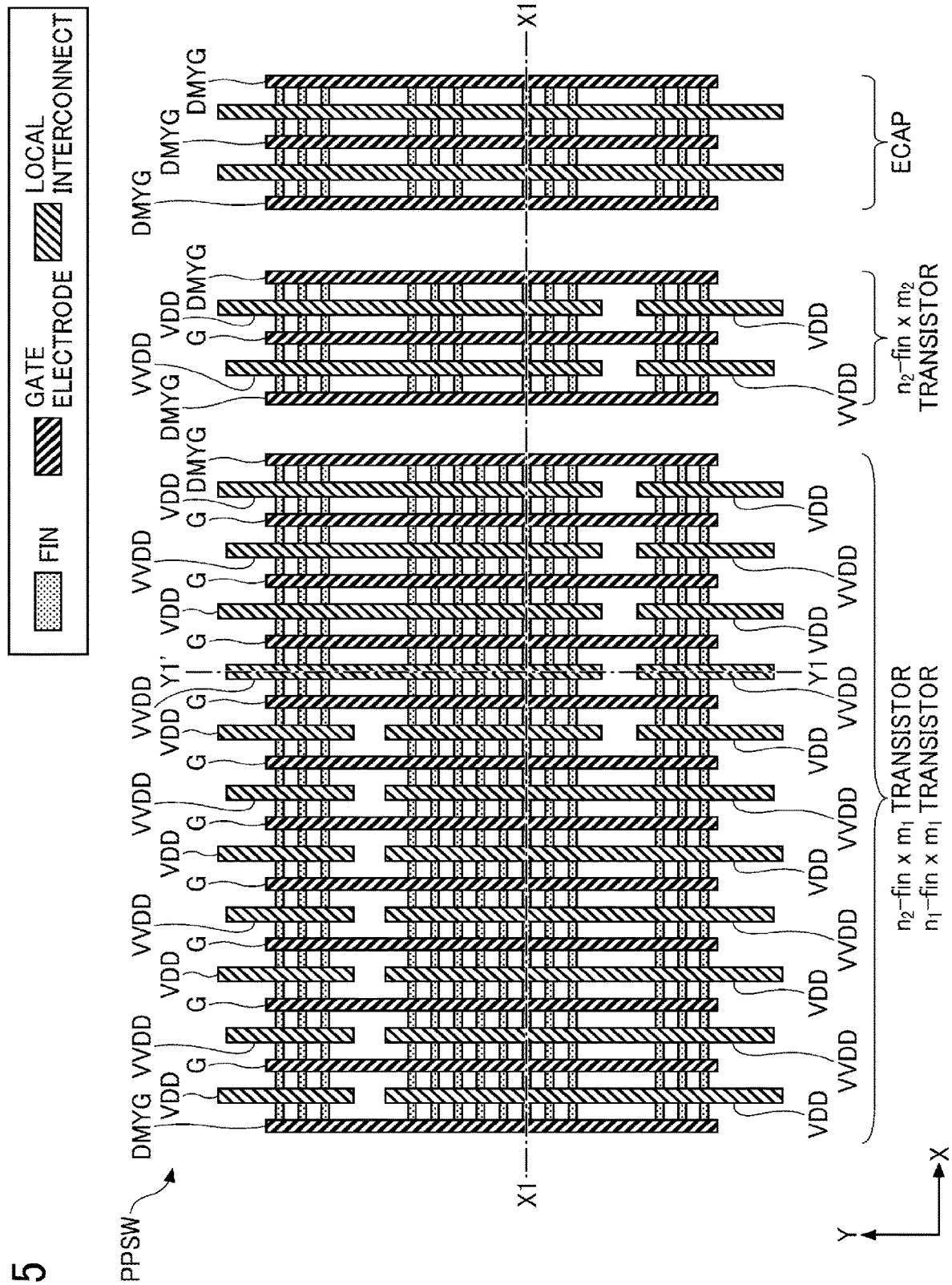
FIG. 5 is a drawing illustrating a layout of fins, gate electrodes, and local interconnects of FIG. 4.

FIG. 5 illustrates the layout of the fins, the gate electrodes G, and the local interconnects of FIG. 4. The gate electrodes G and the local interconnects are formed in the Y direction to cross the fins that extend in the X direction.

Figure 6:
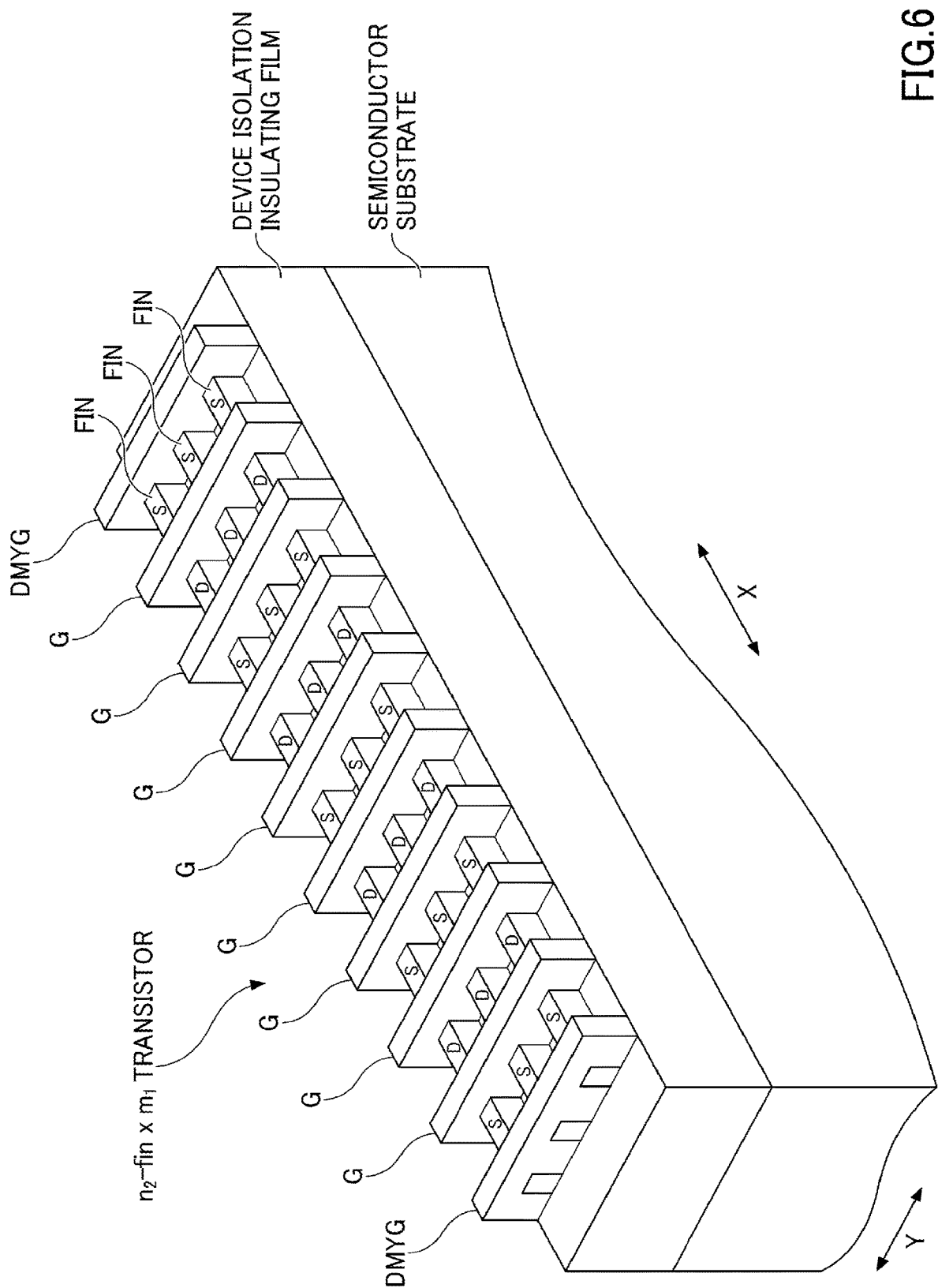
FIG. 6 is a perspective view illustrating an example of a structure of $n_2$-fin×$m_1$ transistors of FIG. 3 and FIG. 4.

FIG. 6 illustrates an example of a structure of the $n_2$-fin× $m_1$ transistor of FIG. 3 and FIG. 4. A fin transistor includes: a fin extending in the X direction provided on the semiconductor substrate; and a gate electrode G extending in the Y direction to cross the fin. A gate insulating film is formed at a portion of the fin facing the gate electrode G, so that a channel of the transistor is formed on the surface portion of the fin covered with the gate insulating film.

Also, a source area S and a drain area D are provided in the fin on either side of the gate electrode G. Although not illustrated, in each of the source areas S and each of the drain areas D, the local interconnect VDD and the local interconnect VVDD are provided along the direction in which the gate electrode G extends. In the power switch circuit PPSW as illustrated in FIG. 4, the P-channel transistors are formed, the source areas S are connected to the wire VDD, and the drain areas D are connected to the wire VVDD. In FIG. 6, the source area S and the drain area D may be swapped with each other.

Figure 7:
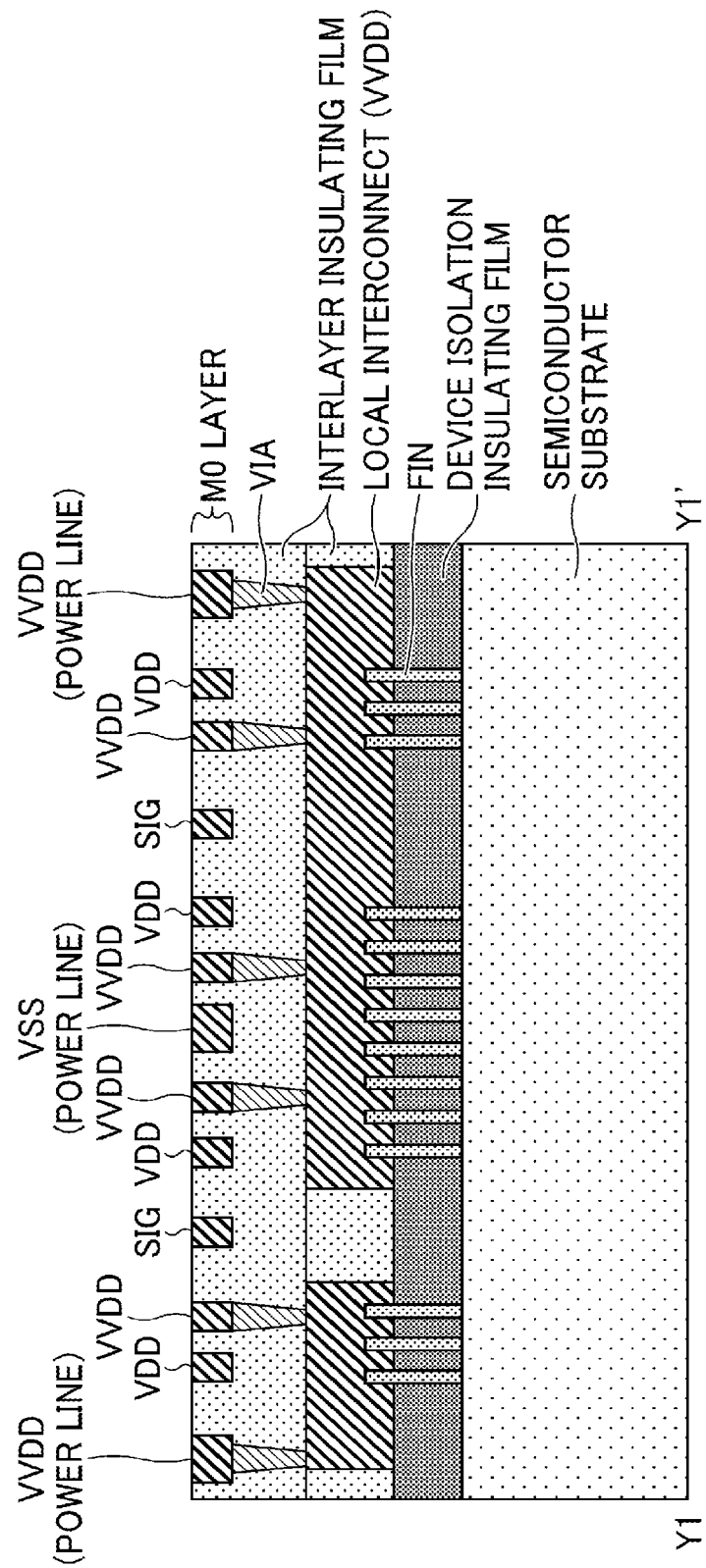
FIG. 7 is a cross-sectional view taken along Y1-Y1' of FIG. 4.

FIG. 7 illustrates a cross section taken along line Y1-Y1' of FIG. 4. The fins are formed in a device isolation insulating film such as a shallow trench isolation (STI) that is formed on the semiconductor substrate. In the cross section illustrated in FIG. 7, upper portions of the fins protruding above the device isolation insulating film are covered with the local interconnects VVDD. In the cross section as illustrated in FIG. 7, each of the local interconnects VVDD is connected to the power line VVDD and the wire VVDD formed in the M0 layer through the vias. The local interconnects VVDD, the vias, and the wires VVDD and VDD formed in the M0 layer are electrically isolated from one another by an interlayer insulating film.

Figure 8:
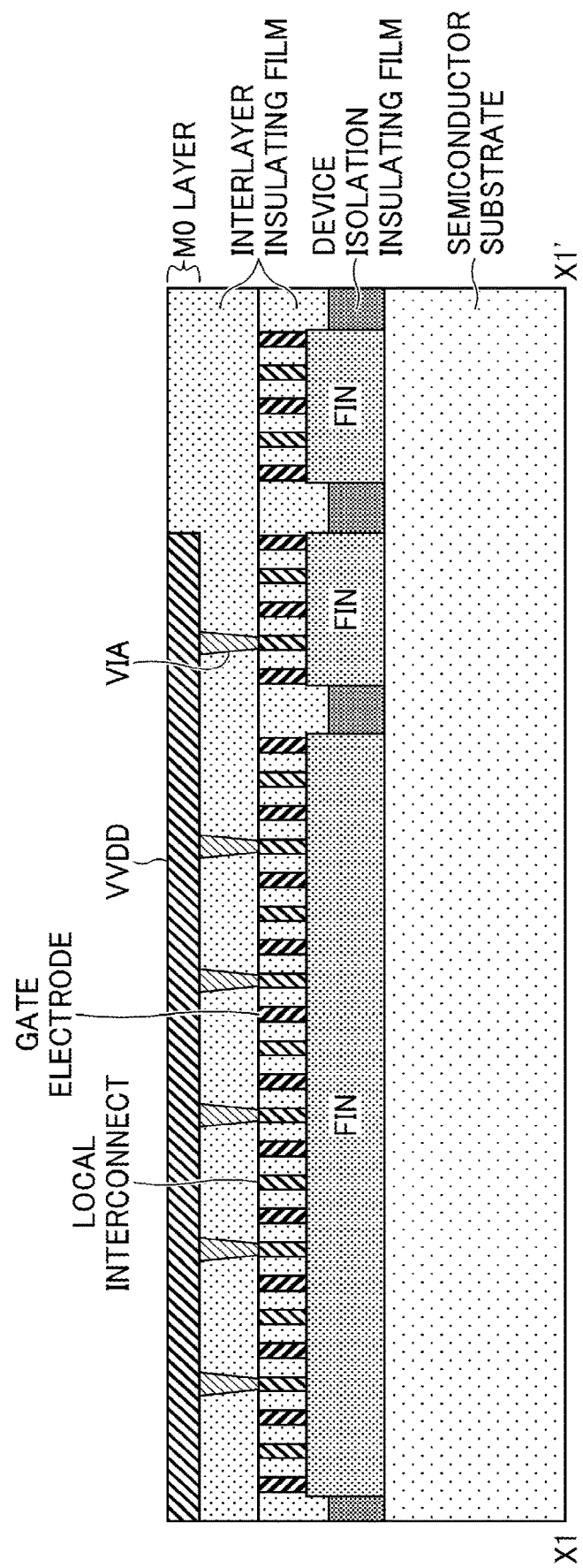
FIG. 8 is a cross-sectional view taken along X1-X1' of FIG. 4.

FIG. 8 illustrates a cross section taken along line X1-X1' of FIG. 4. In the cross section as illustrated in FIG. 8, the local interconnects and the gate electrodes are formed alternately on the fins. Among the local interconnects, a local interconnect connected to the drain area of a transistor, not illustrated, is connected to the wire VVDD formed in the M0 layer.

Figure 9:
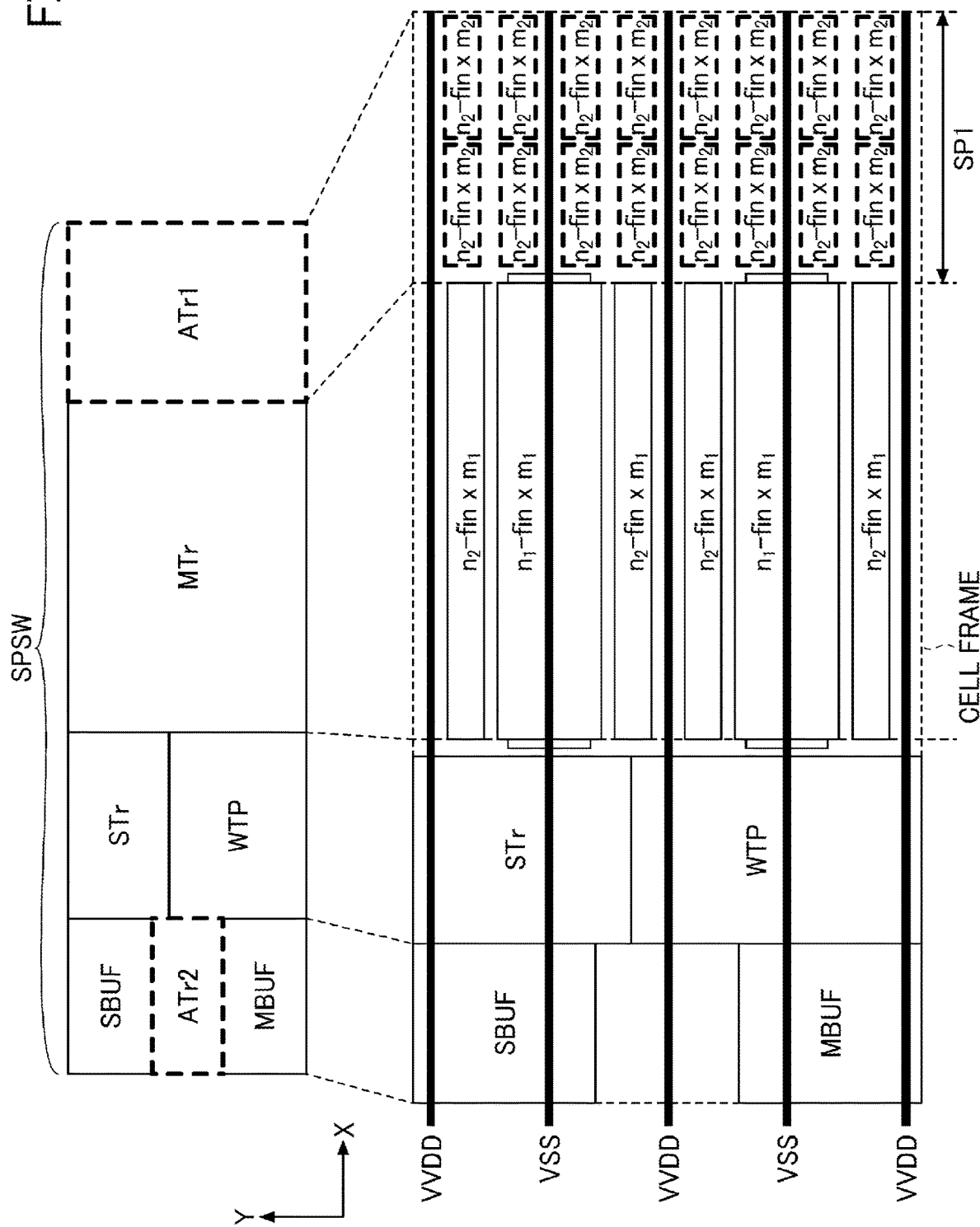
FIG. 9 is a drawing illustrating an example of a layout of the power switch circuit SPSW provided in a standard cell area of FIG. 1.

FIG. 9 illustrates an example of a layout of the power switch circuit SPSW provided in the standard cell area SCA of FIG. 1. Substantially the same components as the components of FIG. 3 are denoted with the same reference numerals, and detailed description thereabout is omitted. The power switch circuit SPSW provided in the standard cell area SCA does not have the end cap ECAP, and the space SP1 defined by the layout rule is unnecessary.

However, for example, in a case where the power switch circuit SPSW is next to an end cap ECAP provided to enclose the standard cell area SCA, it is desired to provide the space SP1 between the power switch circuit SPSW and the end cap ECAP. In such a case, as illustrated in the example of FIG. 9, the additional transistor ATr1 (including $n_2$-fin×$m_2$ transistors) is provided in the space SP1. In a case where the power switch circuit SPSW is provided spaced apart from the end cap ECAP provided to enclose the standard cell area SCA, the space SP1 and the additional transistor ATr1 provided in the space SP1 may be omitted.

The remaining configuration of the power switch circuit SPSW is substantially the same as the configuration of the power switch circuit PPSW of FIG. 3. In addition, in another vacant area of the power switch circuit SPSW (specifically, in this example, a vacant area between the main buffer unit MBUF and the sub-buffer unit SBUF), the additional transistor ATr2 ($n_2$-fin×$m_2$ transistor) that functions as a power switch is provided.

The main transistor MTr and the sub-transistor STr provided in the power switch circuit SPSW are examples of third transistors. The additional transistor ATr1 provided in the power switch circuit SPSW is an example of a fourth transistor. The additional transistor ATr2 is an example of a fifth transistor.

Similarly to the power switch circuit PPSW as illustrated in FIG. 3, the main transistor MTr, the sub-transistor STr, and the additional transistors ATr1 and ATr2 of the power switch circuit SPSW function as the power switch connected to the power line VDD and the virtual power line VVDD. Therefore, in the power switch circuit SPSW, the power supply capacity of the power switch circuit SPSW can be improved by the additional transistor ATr1 provided in the vacant area that occurs due to the limitation associated with the layout rule (i.e., the space SP1).

In this case, the additional transistor ATr1 has the same structure as the $n_2$-fin×$m_2$ transistor used for the logic circuit provided in the standard cell area SCA. Therefore, the power switch circuit SPSW provided next to the end cap ECAP can alleviate variation in the shapes of the gate electrodes and the like due to other circuits, other patterns, and the like provided outside of the standard cell area SCA.

In the power switch circuit SPSW, the power supply capacity of the power switch circuit SPSW can be improved by the additional transistor ATr2 provided in the vacant area that occurs due to the circuit layout. As a result, the power supply capacity can be improved without increasing the layout area of the power switch circuit SPSW.

Specifically, by providing the additional transistors ATr1 and ATr2 in the vacant area, the power supply capacity of the P-channel transistor PT2 can be improved while alleviating the increase of the layout area of the power switch circuit SPSW.

Figure 10:
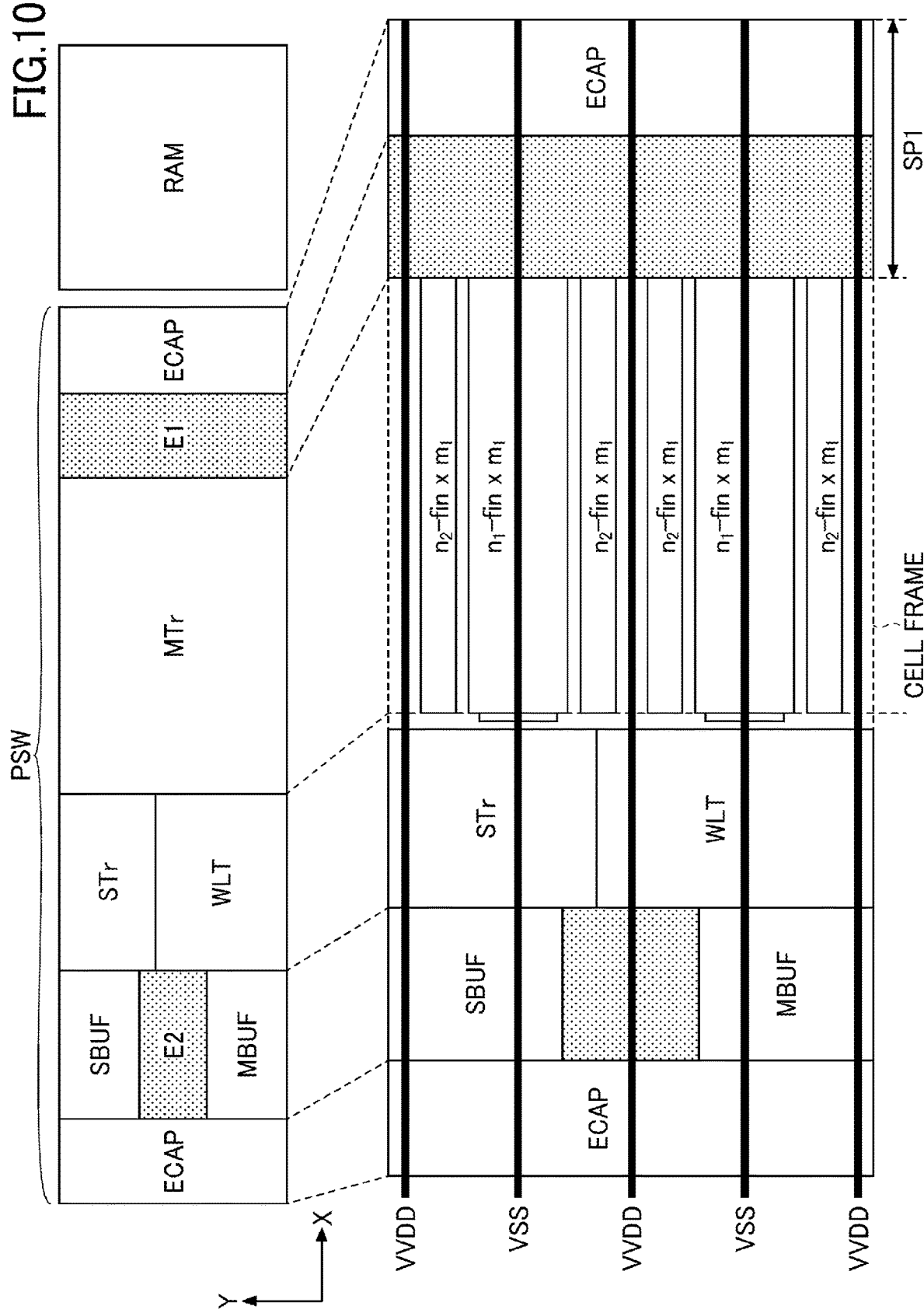
FIG. 10 is a drawing illustrating an example of a circuit layout of another power switch circuit according to a comparative example.

FIG. 10 illustrates an example of a circuit layout of another power switch circuit PSW according to a comparative example. Substantially the same components as the components of FIG. 3 are denoted with the same reference numerals, and detailed description thereabout is omitted. In the power switch circuit PSW as illustrated in FIG. 10, transistors are not provided in the areas where the additional transistors ATr1 and ATr2 are provided in the power switch circuit PPSW of FIG. 3, and these areas are vacant areas E1 and E2 in the another power switch circuit PSW according to the comparative example. In this case, the power supply capacity of the power switch circuit PSW is lower than the power supply capacity of the power switch circuit PPSW of FIG. 3 and the power switch circuit SPSW of FIG. 9.

Hereinabove, in this embodiment, the additional transistor ATr1 is provided in the vacant area that occurs due to the limitation associated with the layout rule (i.e., the space SP1) in each of the power switch circuits PPSW and SPSW. Accordingly, the power supply capacity can be improved without increasing the layout areas of the power switch circuits PPSW and SPSW. In other words, even in a case where a vacant area is desired to be provided in the power switch circuits PPSW and SPSW due to the limitation associated with the layout rule, the reduction of the power supply capacity can be alleviated.

The additional transistor ATr1 has the same structure as the 3fin×1 transistor used for the logic circuit provided in the standard cell area SCA. Therefore, this can contribute to the reduction of variation in the shapes of the gate electrodes and the like of circuits provided next to the power switch circuits PPSW and SPSW.

In addition, in the power switch circuits PPSW and SPSW, the power supply capacity of the power switch circuits PPSW and SPSW can be improved by the additional transistor ATr2 provided in the vacant area that occurs due to the circuit layout. Accordingly, the power supply capacity can be improved without increasing the layout areas of the power switch circuits PPSW and SPSW.

Second Embodiment

Figure 11:
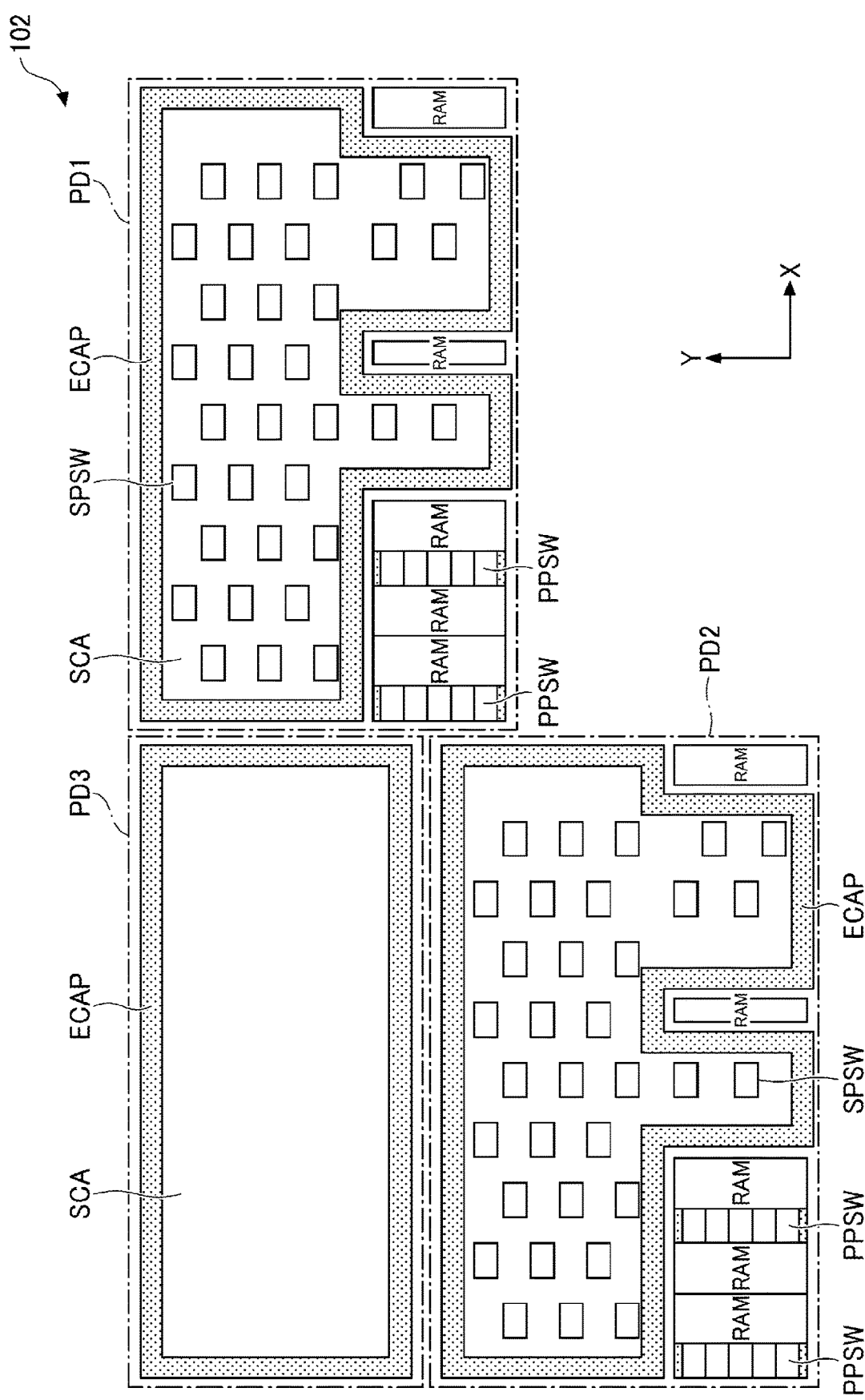
FIG. 11 is a drawing illustrating an example of a layout of a semiconductor device according to a second embodiment.

FIG. 11 illustrates an example of a layout of a semiconductor device 102 according to the second embodiment. Substantially the same components as the components of FIG. 1 are denoted with the same reference numerals, and detailed description thereabout is omitted. The semiconductor device 102 as illustrated in FIG. 10 includes, for example, power domains PD2 and PD3 on the left side in the X direction of the power domain PD1 as illustrated in FIG. 1.

In the power domain PD2, substantially the same circuit as the power domain PD1 is provided. In the power domain PD3, a circuit that operates at all times while the power is supplied to the semiconductor device 102 is provided, and therefore, the power switch circuits PPSW and SPSW are not provided in the power domain PD3.

Hereinabove, in this embodiment, even in a case where multiple power domains PD1, PD2, and PD3 are provided next to each other, the power supply capacity can be improved without increasing the layout areas of the power switch circuits PPSW and SPSW, in a manner similar to the above-described first embodiment.

Third Embodiment

Figure 12:
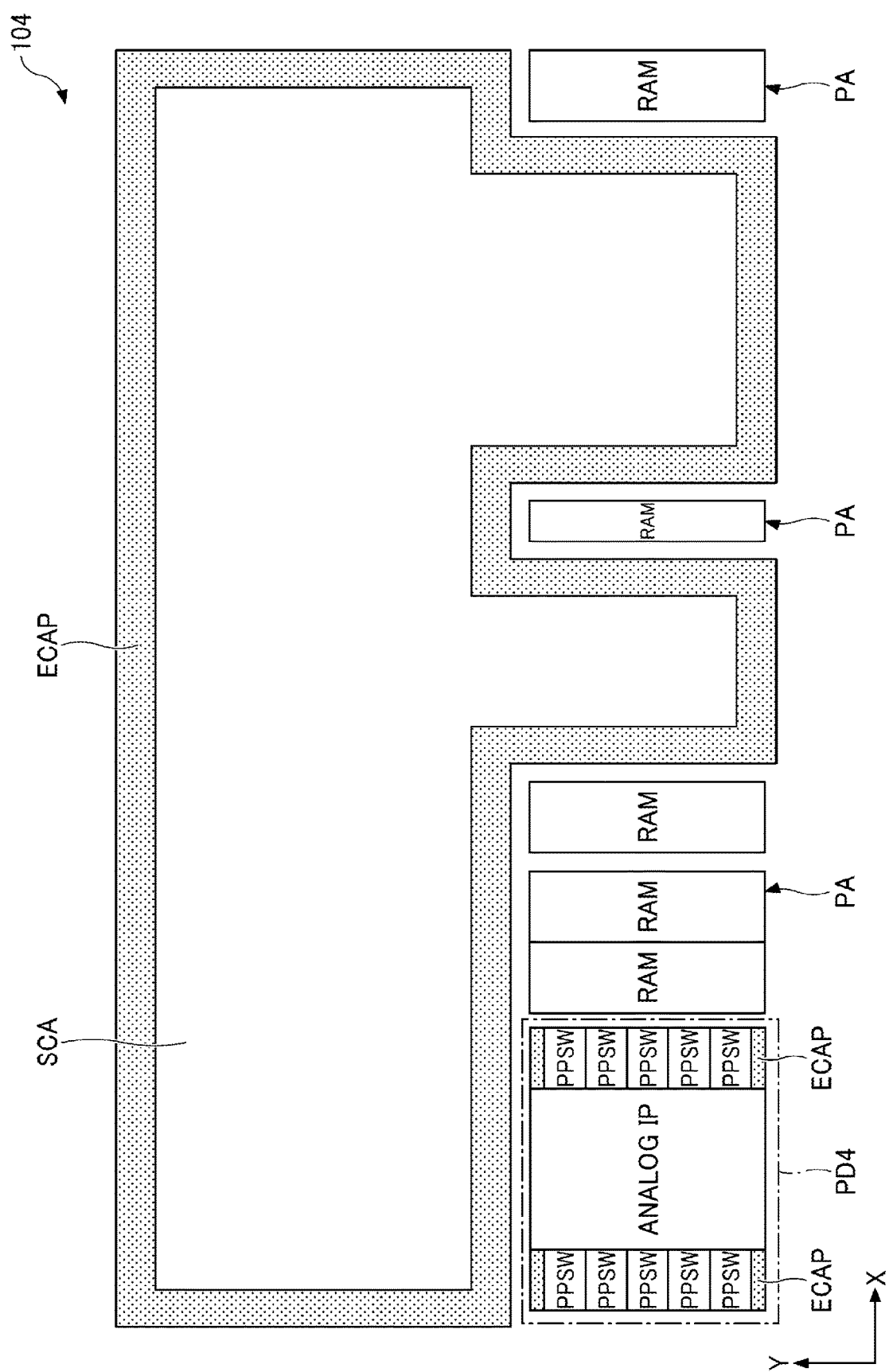
FIG. 12 is a drawing illustrating an example of a layout of a semiconductor device according to a third embodiment.

FIG. 12 illustrates an example of a layout of a semiconductor device 104 according to the third embodiment. Substantially the same components as the components of FIG. 1 are denoted with the same reference numerals, and detailed description thereabout is omitted. In the semiconductor device 104 as illustrated in FIG. 11, RAMs and an analog IP are provided in the peripheral areas PA.

In the semiconductor device 104, circuits other than the analog IP operate at all times while the power is supplied to the semiconductor device 104. Therefore, power switch circuits PPSW are provided on both sides of the analog IP in the X direction, and the analog IP and the power switch circuits PPSW belong to the power domain PD4.

Hereinabove, in this embodiment, the power supply capacity can be improved without increasing the layout area of the power switch circuit PPSW, in a manner similar to the above-described embodiments.

Fourth Embodiment

Figure 13:
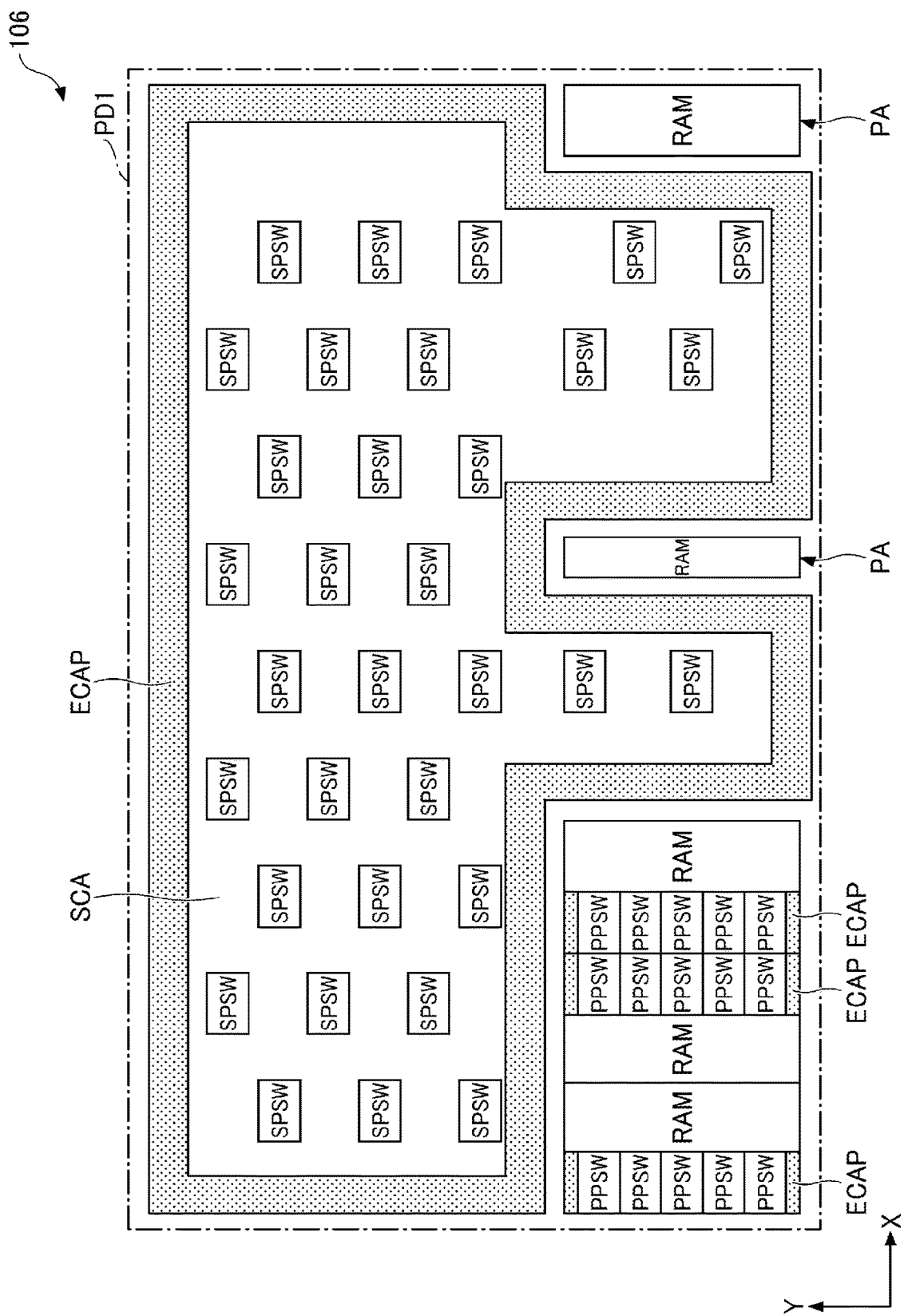
FIG. 13 is a drawing illustrating an example of a layout of a semiconductor device according to a fourth embodiment.

FIG. 13 illustrates an example of a layout of a semiconductor device 106 according to the fourth embodiment. Substantially the same components as the components of FIG. 1 are denoted with the same reference numerals, and detailed description thereabout is omitted. The semiconductor device 106 as illustrated in FIG. 13 includes two rows of power switch circuits in an area next to RAMs. The two rows of power switch circuits include multiple power switch circuits PPSW. Multiple power switch circuits PPSW in each of the two rows of power switch circuits are arranged in the Y direction. Specifically, the semiconductor device 106 includes the power switch circuits PPSW that are greater in number than the power switch circuits PPSW of the semiconductor device 100 of FIG. 1. The remaining configuration of the semiconductor device 106 is substantially the same as the configuration of the semiconductor device 100 of FIG. 1.

Hereinabove, in this embodiment, the power supply capacity can be improved without increasing the layout area of the power switch circuit PPSW, in a manner similar to the above-described embodiments. Furthermore, in this embodiment, in a case where the power domain PD1 of the semiconductor device 106 includes the vacant area, the power switch circuits PPSW are added by making use of the vacant area, so that the power supply capacity of the power domain PD1 can be further improved.

Fifth Embodiment

Figure 14:
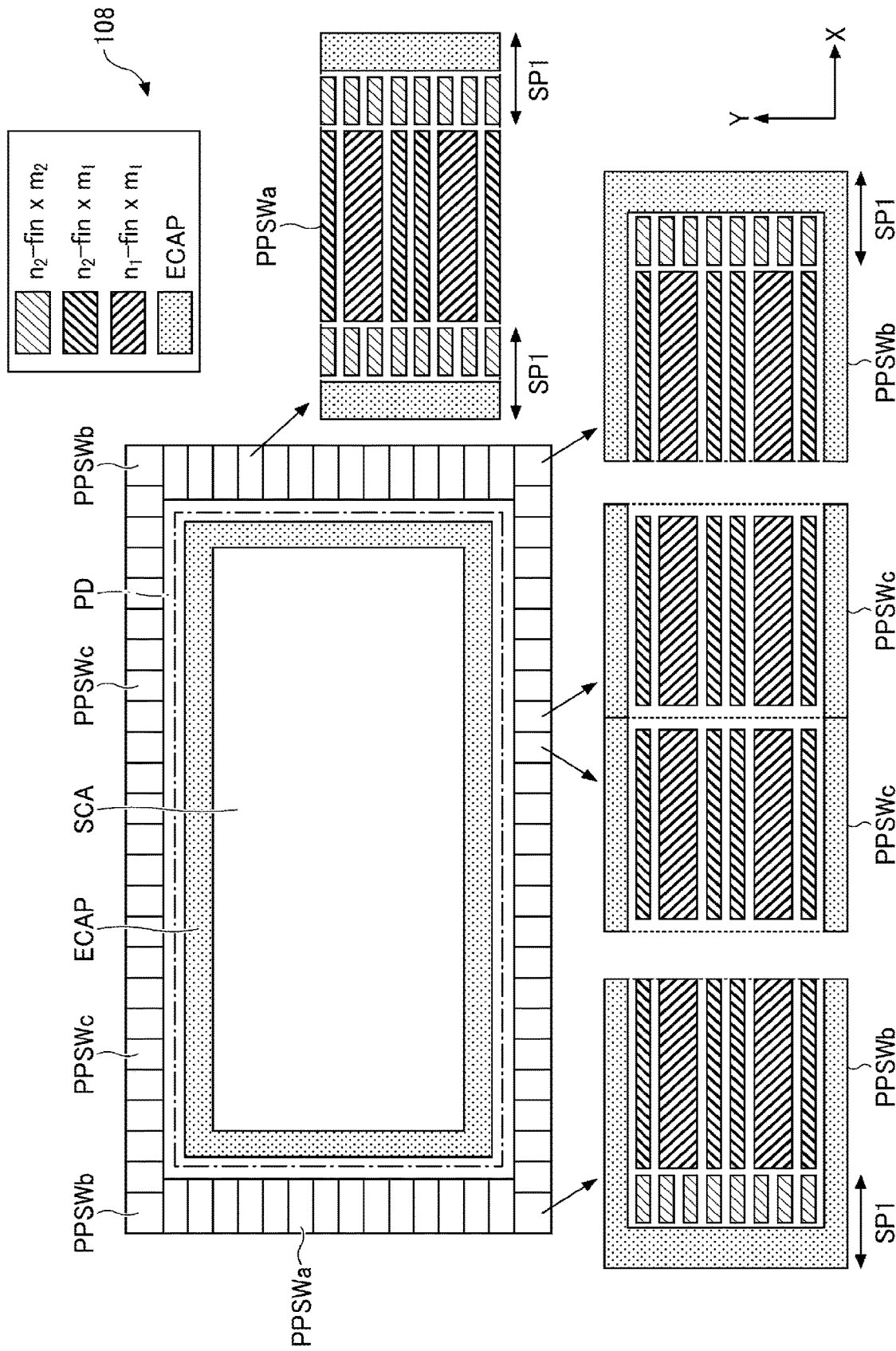
FIG. 14 is a drawing illustrating an example of a layout of a semiconductor device according to a fifth embodiment.

FIG. 14 illustrates an example of a layout of a semiconductor device 108 according to a fifth embodiment. Substantially the same components as the components of FIG. 1 are denoted with the same reference numerals, and detailed description thereabout is omitted. The semiconductor device 108 as illustrated in FIG. 14 includes multiple types of power switch circuits PPSW (PPSWa, PPSWb, and PPSWc) that are arranged in power switch areas provided around the standard cell area SCA. The power switch circuits SPSW as illustrated in FIG. 1 are not provided in the standard cell area SCA. The powers VVDD that are operation powers of circuits provided in the standard cell area SCA are supplied from the power switch circuits PPSW through a wire layer in an upper layer, not illustrated.

The power switch circuits PPSWa are provided on both sides of the standard cell area SCA in the X direction. The power switch circuits PPSWa include $n_2$-fin×$m_1$ transistors and $n_1$-fin×$m_1$ transistors arranged in the central portion in the X direction. In addition, the power switch circuit PPSWa includes $n_2$-fin×$m_2$ transistors and end caps ECAP arranged on both sides in the X direction that is a direction in which the gate electrodes of the $n_2$-fin×$m_1$ transistors and the $n_1$-fin×$m_1$ transistors are arrayed.

The $n_2$-fin×$m_2$ transistors are provided next to the $n_2$-fin×$m_1$ transistors and the $n_1$-fin×$m_1$ transistors. The end cap ECAP is arranged on the opposite side of the $n_2$-fin×$m_2$ transistors from the $n_2$-fin×$m_1$ transistors and the $n_1$-fin×$m_1$ transistors. Spaces SP1 defined by the layout rule are secured by the end cap ECAP and the $n_2$-fin×$m_2$ transistors next to the end cap ECAP.

The power switch circuits PPSWb are arranged at corner portions around the standard cell area SCA. The end caps ECAP are provided in the peripheral portions of the power switch circuits PPSWb except the end portion on the side of the power switch circuit PPSWc. In addition, the power switch circuits PPSWb include: the $n_2$-fin×$m_2$ transistors next to the end cap ECAP provided at the end in the X direction; and the $n_1$-fin×$m_1$ transistors and $n_2$-fin×$m_1$ transistors provided next to the rows of the $n_2$-fin×$m_2$ transistors. Likewise, in the power switch circuit PPSWb, spaces SP1 are also secured by the end cap ECAP and the $n_2$-fin×$m_2$ transistors next to the end cap ECAP.

The power switch circuits PPSWc are arranged on both sides of the standard cell area SCA in the Y direction. The power switch circuits PPSWc have a configuration in which the $n_2$-fin×$m_2$ transistors and the end cap ECAP next to the $n_2$-fin×$m_2$ transistors in the X direction are removed from the power switch circuit PPSWb.

The power switch circuits PPSWa, PPSWb, and PPSWc do not have to include a main buffer unit MBUF and a sub-buffer unit SBUF. In this case, the power switch control circuits PCNT1 as illustrated in FIG. 2 are provided outside of the power switch circuits PPSWa, PPSWb, and PPSWc.

Hereinabove, in this embodiment, the power supply capacity can be improved without increasing the layout area of the power switch circuit PPSW, in a manner similar to the above-described embodiments. Further, in this embodiment, the power switch circuits PPSWa, PPSWb, and PPSWc are provided around the standard cell area SCA, and accordingly, it is not necessary to provide the power switch circuits SPSW in the standard cell area SCA. Therefore, the logic circuits in the standard cell area SCA can be connected without being affected by the power switch circuits SPSW, and the propagation delay times of signals can be minimized. As a result, this can contribute to the improvement of the performance of the semiconductor device 108.

Sixth Embodiment

Figure 15:
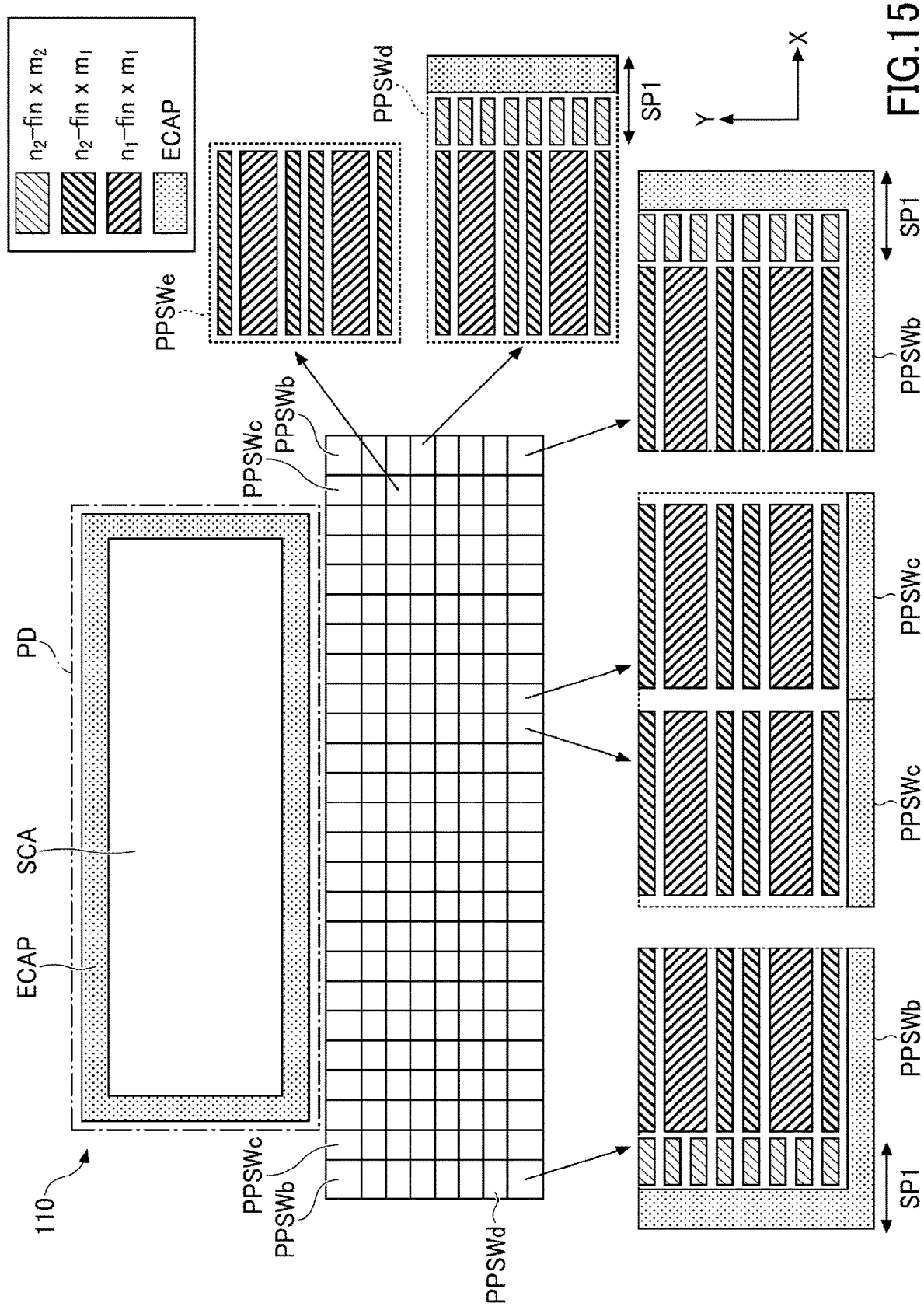
FIG. 15 is a drawing illustrating an example of a layout of a semiconductor device according to a sixth embodiment.

FIG. 15 illustrates an example of a layout of a semiconductor device 110 according to the sixth embodiment. Substantially the same components as the components of FIG. 1 and FIG. 14 are denoted with the same reference numerals, and detailed description thereabout is omitted. The semiconductor device 110 as illustrated in FIG. 15 includes multiple types of power switch circuits PPSW (PPSWb, PPSWc, PPSWd, and PPSWe) that are arranged in power switch areas that are provided next to one side of the standard cell area SCA in the Y direction. Similar to FIG. 14, the power switch circuits SPSW as illustrated in FIG. 1 are not provided in the standard cell area SCA. Therefore, the powers VVDD that are operation powers of circuits provided in the standard cell area SCA are supplied from the power switch circuits PPSW through a wire layer in an upper layer, not illustrated.

In this embodiment, the power switch circuits PPSWe are provided on the inner side of the power switch circuits PPSWb, PPSWc, and PPSWd provided in the ring shape. The power switch circuits PPSWb and PPSWc have the same configuration as the power switch circuits PPSWb and PPSWc of FIG. 14.

The power switch circuits PPSWd include $n_2$-fin×$m_1$ transistors and $n_1$-fin×$m_1$ transistors arranged on the left side in the X direction. Also, the power switch circuits PPSWd include $n_2$-fin×$m_2$ transistors and end cap ECAP provided successively on the opposite side of the power switch circuits PPSWe in the X direction.

Also, spaces SP1 are secured by $n_2$-fin×$m_2$ transistors and the end cap ECAP next to the $n_2$-fin×$m_2$ transistors. The power switch circuits PPSWd have a configuration in which one row of $n_2$-fin×$m_2$ transistors and one end cap ECAP are removed from the power switch circuit PPSWa of FIG. 14. This is because one end of the power switch circuit PPSWd in the X direction is provided without being next to the standard cell area SCA.

The power switch circuits PPSWe are provided on the inner side of the power switch circuits PPSWb, PPSWc, and PPSWd, and therefore, the power switch circuits PPSWe do not include the $n_2$-fin×$m_2$ transistors and the end cap ECAP for securing the space SP1. Therefore, the power switch circuit PPSWe includes only the $n_2$-fin×$m_1$ transistors and the $n_2$-fin×$m_1$ transistors.

Hereinabove, in this embodiment, the power supply capacity can be improved without increasing the layout area of the power switch circuit PPSW, in a manner similar to the above-described embodiments.

The above-described embodiments have been applied to the power switch circuits PSW1 and PSW2 having FinFETs, for example. The above-described embodiments may also be applied to power switch circuits including planar transistors, nanowire transistors, nanosheet transistors, fork sheet transistors, complementary FETs (CFETs), vertical nanowire transistors, and the like.

According to the present disclosure, the reduction of the power supply capacity can be alleviated even in a case where the vacant area is required in the power switch circuit.

Although the present invention has been described above with reference to the embodiments, the present invention is not limited to the features described in the embodiments. These features can be changed without departing from the scope of the claimed subject matter, and can be appropriately determined according to the implementation to which the present invention is applied.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a first power line;
   a second power line;
   an end cap; and
   a first power switch circuit that includes a first transistor and a second transistor,
   wherein
   the first transistor is connected to the first power line and the second power line,
   the second transistor is connected to the first power line and the second power line,
   the first transistor includes a first number of first fins that are extended in a first direction and arranged in a second direction that is different from the first direction,
   the second transistor includes a second number of second fins that are extended in the first direction and arranged in the second direction,
   the first number is larger than the second number, and
   the second transistor is provided between the end cap and the first transistor in the first direction.

2. The semiconductor device according to claim 1, wherein the end cap includes the second number of third fins.

3. The semiconductor device according to claim 1, wherein
   the first power switch circuit includes a third transistor that is connected to the first power line and the second power line,
   the third transistor includes the second number of fourth fins that are extended in the first direction and arranged in the second direction, and
   the third transistor is next to the first transistor in the second direction.

4. The semiconductor device according to claim 1, further comprising
   a logic circuit; and
   a functional circuit,
   wherein the end cap is provided between the functional circuit and the second transistor in the first direction.

5. The semiconductor device according to claim 4, wherein the logic circuit includes the second number of fifth fins that are extended in the first direction and arranged in the second direction.

6. The semiconductor device according to claim 1, wherein
   the first power switch circuit includes a fourth transistor that is connected to the first power line and the second power line,
   the fourth transistor includes the second number of sixth fins that are extended in the first direction and arranged in the second direction, and
   the fourth transistor is provided at an opposite side to the second transistor in the first direction.

7. The semiconductor device according to claim 4, further comprising
   a second power switch circuit that includes a fifth transistor and a sixth transistor,
   wherein
   the fifth transistor is connected to the first power line and the second power line,
   the sixth transistor is connected to the first power line and the second power line,
   the fifth transistor includes a third number of seventh fins that are extended in the first direction and arranged in the second direction,
   the sixth transistor includes a fourth number of eighth fins that are extended in the first direction and arranged in the second direction,
   the third number is larger than the fourth number, and
   the sixth transistor is provided between the logic circuit and the fifth transistor in the first direction.

8. The semiconductor device according to claim 7, wherein the logic circuit includes the fourth number of ninth fins that are extended in the first direction and arranged in the second direction.

* * * * *